US008021818B2

(12) United States Patent
Kwon et al.

(10) Patent No.: US 8,021,818 B2
(45) Date of Patent: Sep. 20, 2011

(54) PRINTING PLATE, METHOD OF MANUFACTURING OF PRINTING PLATE AND LIQUID CRYSTAL DISPLAY DEVICE USING THE SAME

(75) Inventors: Oh Nam Kwon, Yongin-si (KR); Seung Hee Nam, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/410,963

(22) Filed: Apr. 25, 2006

(65) Prior Publication Data

US 2007/0117047 A1 May 24, 2007

(30) Foreign Application Priority Data

Nov. 21, 2005 (KR) ........................ 10-2005-0111248

(51) Int. Cl.
*G03F 7/09* (2006.01)
*G03F 7/11* (2006.01)

(52) U.S. Cl. ............... 430/270.1; 430/276.1; 430/277.1; 430/300; 101/453

(58) Field of Classification Search ............... 430/270.1, 430/271.1, 273.1, 275.1, 276.1, 277.1, 300, 430/302, 309, 310, 314, 311, 313
See application file for complete search history.

(56) References Cited

U.S. PATENT DOCUMENTS

| | | | | |
|---|---|---|---|---|
| 3,930,857 | A * | 1/1976 | Bendz et al. | 430/313 |
| 4,855,017 | A * | 8/1989 | Douglas | 438/695 |
| 5,202,279 | A * | 4/1993 | Chung et al. | 438/386 |
| 5,587,090 | A * | 12/1996 | Belcher et al. | 216/17 |
| 5,858,547 | A * | 1/1999 | Drage | 428/451 |
| 6,190,988 | B1 * | 2/2001 | Furukawa et al. | 438/386 |
| 6,663,986 | B2 * | 12/2003 | Sanders | 428/811.5 |
| 2002/0081502 | A1 * | 6/2002 | Hayano et al. | 430/5 |
| 2002/0127495 | A1 * | 9/2002 | Scherer | 430/314 |
| 2003/0080471 | A1 * | 5/2003 | Chou | 264/338 |
| 2004/0030012 | A1 * | 2/2004 | Sato | 524/147 |
| 2006/0063348 | A1 * | 3/2006 | Chen et al. | 438/403 |
| 2007/0048676 | A1 * | 3/2007 | Kwon et al. | 430/323 |

FOREIGN PATENT DOCUMENTS

| | | | |
|---|---|---|---|
| CN | 1308836 | A | 8/2001 |
| JP | 06-003522 | | 1/1994 |
| KR | 10-2003-0028924 | A | 4/2003 |
| KR | 10-2005-0105043 | A | 11/2005 |
| KR | 10-2005-0105046 | A | 11/2005 |

OTHER PUBLICATIONS

Office Action issued in corresponding Korean Patent Application No. 10-2005-0133110; issued Mar. 31, 2009.
Office Action issued in corresponding Chinese Patent Application No. 200610094347.2;issued Sep. 18, 2009.

* cited by examiner

*Primary Examiner* — Cynthia Kelly
*Assistant Examiner* — Anca Eoff
(74) *Attorney, Agent, or Firm* — Brinks Hofer Gilson & Lione

(57) ABSTRACT

A printing plate to form a precise pattern, a method for manufacturing the printing plate, and a method for fabricating an LCD device using the printing plate in which the printing plate includes a substrate having at least one trench and side-wall elements formed at an inner perimeter of the at least one trench.

6 Claims, 8 Drawing Sheets

PRINTING PLATE, METHOD OF MANUFACTURING OF PRINTING PLATE AND LIQUID CRYSTAL DISPLAY DEVICE USING THE SAME

PRIORITY CLAIM

This application claims the benefit of the Korean Patent Application No. P2005-111248, filed on Nov. 21, 2005, which is hereby incorporated by reference as if fully set forth herein.

TECHNICAL FIELD

The present invention relates, generally, to a liquid crystal display (LCD) device and, more particularly, to a printing plate used for a patterning process of an LCD device, a method for manufacturing the printing plate, and a method for fabricating an LCD device using the printing plate.

DISCUSSION OF THE RELATED ART

Among various ultra-thin flat type display devices, which include a display screen having a thickness of several centimeters, a liquid crystal display (LCD) device can be widely used for notebook computers, monitors, aircraft, and the like, since it has advantages such as low power consumption and portability.

The LCD device includes lower and upper substrates facing each other at a predetermined interval therebetween, and a liquid crystal layer formed between the lower and upper substrates.

The lower substrate comprises a gate line, a data line, and a thin film transistor. At this time, the gate line is formed in perpendicular to the data line, to define a unit pixel region. Then, the thin film transistor is formed adjacent to a crossing of the gate and data lines, wherein the thin film transistor serves as a switching device. In addition, a pixel electrode is connected with the thin film transistor.

The upper substrate comprises a black matrix layer for shielding the gate line, the data line and the thin film transistor from light, a color filter layer formed on the black matrix layer, and a common electrode formed on the color filter layer.

The above LCD device includes various elements formed by repeated steps. Especially, a photolithography is used so as to form the elements in various shapes.

For the photolithography, it is necessary to form a pattern material layer on a substrate, to deposit a photoresist on the pattern material layer, to position a mask of a predetermined pattern above the photoresist, and to pattern the photoresist according to the predetermined pattern of the mask by exposure and development. After that, the pattern material layer is etched using the patterned photoresist as a mask.

The photolithograph necessarily uses the photoresist and the mask of the predetermined pattern, to thereby increase a manufacturing cost. In addition, since the photolithography requires exposure and development, it causes a complicated process and an increasing manufacturing time.

To overcome these problems of the photolithography, a new patterning method has been developed, for example, a printing method using a printing roller.

A patterning method using a printing roller according to the related art will be described with reference to the accompanying drawings.

FIGS. 1A to 1C are cross sectional views of illustrating a process for forming a pattern material layer on a substrate with a printing roller according to the related art.

As shown in FIG. 1A, first, a pattern material 30 is provided through a printing nozzle 10, and is coated on a printing roller 20.

Then, as shown in FIG. 1B, the printing roller 20 having the pattern material 30 coated thereon rolls on a printing plate 40 having a plurality of concave patterns. Accordingly, some pattern material 30*b* is printed on the printing plate 40, and the other pattern material 30*a* is left on the printing roller 20. That is, a predetermined pattern of the pattern material is formed on the printing roller 20.

Referring to FIG. 1C, as the printing roller 20 having the pattern material of the predetermined pattern rolls on a substrate 50, the pattern material 30*a* is printed on the substrate 50.

The patterning method using the printing roller requires the printing plate.

A method for manufacturing a printing plate will be described as follows.

FIGS. 2A to 2C are cross sectional views of illustrating a method for manufacturing a printing plate according to the related art. FIG. 3 is a cross sectional view of illustrating a problem generated when forming a pattern with a printing plate according to the related art.

As shown in FIG. 2A, a mask layer 60 of a predetermined pattern is formed on a substrate 45.

Then, as shown in FIG. 2B, the substrate 45 is selectively removed in an isotropic etching process using the mask layer 60 of the predetermined pattern, to thereby forming a trench 70.

As shown in FIG. 2C, the mask layer 60 of the predetermined pattern is removed from the substrate 45, thereby completing a printing plate 40.

However, the related art method for manufacturing the printing plate has the following disadvantages.

In the case of the related art method for manufacturing the printing plate, it is impossible to form a precise pattern. That is, as shown in FIG. 2B, when etching the substrate 45, the substrate 45 is etched in a horizontal direction ('B' of FIG. 2B) as well as in a vertical direction ('A' of FIG. 2B). As a result, a width 'Y' of the trench formed in the substrate is larger than a width 'X' of the pattern formed in the mask layer 60.

Accordingly, when forming a pattern using the printing plate according to the related art, preciseness of the pattern is deteriorated. That is, as shown in FIG. 3, since a slope of the trench 70 is gentle, the pattern material may be printed on the edge of the trench when printing the pattern material 30*b* on the printing plate 40.

SUMMARY

Accordingly, the present invention is directed to a printing plate used for a patterning process of an LCD device, a method for manufacturing the printing plate, and a method for fabricating an LCD device using the printing plate, which substantially obviates one or more problems due to limitations and disadvantages of the related art.

In accordance with one aspect of the invention, as embodied and broadly described herein, a printing plate for roll printing includes a substrate having at least one trench and sidewall elements formed at an inner perimeter portion of the at least one trench.

In another aspect of the invention, a method for manufacturing a printing plate includes forming a mask layer on a substrate, the mask layer having at least one opening. At least one trench is formed in the substrate corresponding to the at least one opening of the mask layer and sidewall elements are formed on a perimeter portion of the at least one trench. The sidewall elements expose a predetermined portion of the at least one trench corresponding the at least one opening in the mask layer.

In yet another aspect of the present invention, a method for fabricating an LCD device includes preparing at least one printing plate having at least one trench and sidewall elements along an inner perimeter of the at least one trench. A black matrix layer is formed on a first substrate and a color filter layer is formed on the first substrate and a on portion of the black matrix layer. One or both of the black matrix layer and the color filter layer are formed with the at least one printing plate. The first substrate is bonded to a second substrate at predetermined intervals therebetween.

In a further aspect of the invention, method for fabricating an LCD device includes preparing at least one printing plate having at least one trench and sidewall elements along an inner perimeter of the at least one trench. A material layer is formed on a TFT substrate, where the material layer is configured to form a component of the TFT substrate. A photoresist pattern is formed on the material layer using the at least one printing plate and the component is formed by etching the material layer using the photoresist pattern as an etching mask.

It is to be understood that both the foregoing general description and the following detailed description of the present invention are exemplary and explanatory and are intended to provide further explanation of the invention as claimed.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a printing plate used for a patterning process of an LCD device, a method for manufacturing the printing plate, and a method for fabricating an LCD device using the printing plate according to the present invention will be described with reference to the accompanying drawings.

FIGS. 4A to 4D are cross sectional views illustrating a method for manufacturing a printing plate according to the present invention.

Figure 1A:
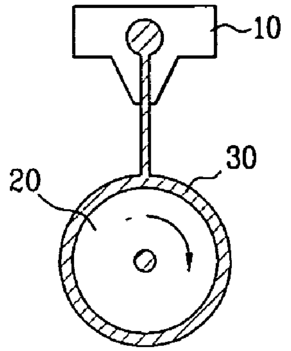
FIG. 1A Related Art
FIGS. 1A to 1C are cross sectional views illustrating a process for forming a pattern on a substrate with a printing roller according to the related art.
Figure 1B:
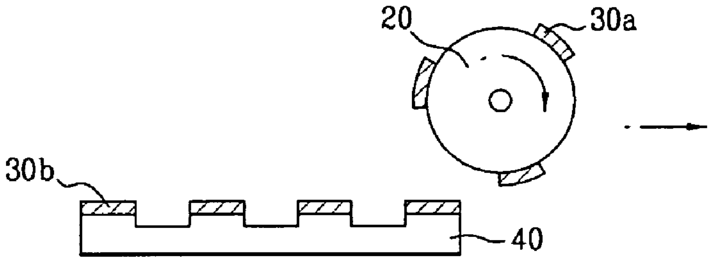
FIG. 1B Related Art
Figure 1C:
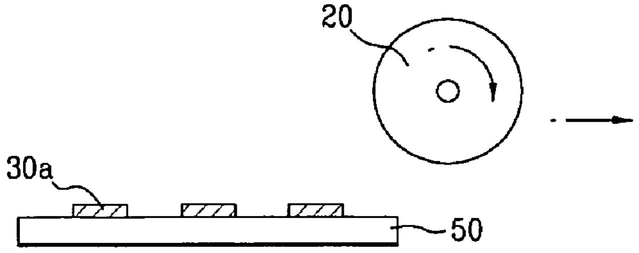
FIG. 1C Related Art
Figure 2A:
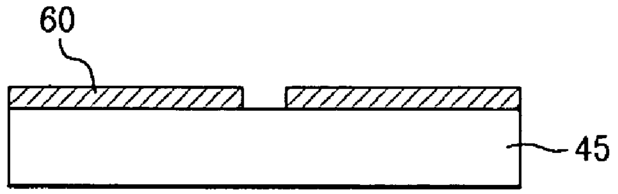
FIG. 2A Related Art
FIGS. 2A to 2C are cross sectional views illustrating a method for manufacturing a printing plate according to the related art.
Figure 2B:
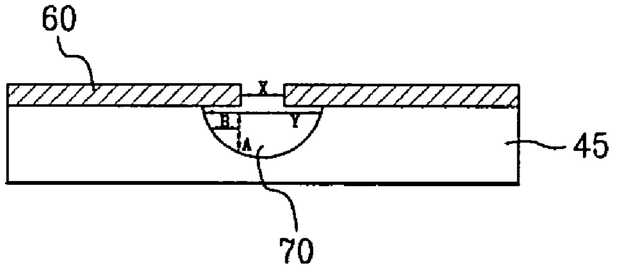
FIG. 2B Related Art
Figure 2C:
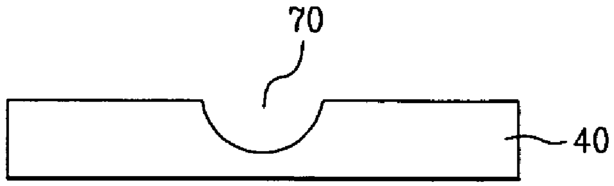
FIG. 2C Related Art
Figure 3:
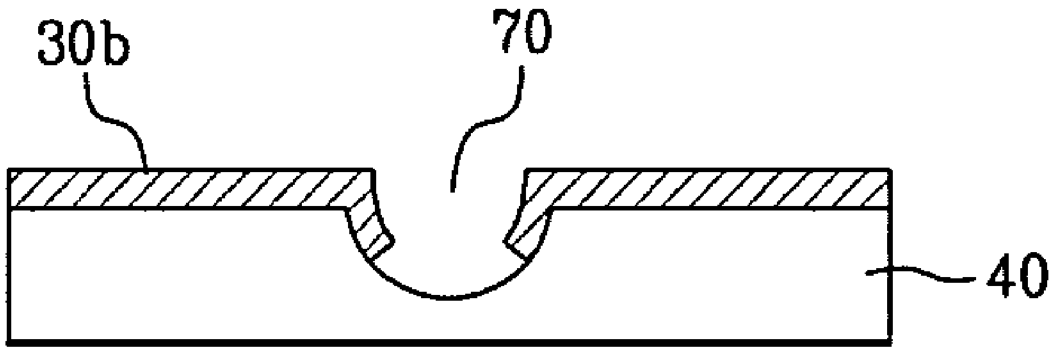
FIG. 3 Related Art
FIG. 3 is a cross sectional view illustrating a problem generated when forming a pattern with a printing plate according to the related art.
Figure 4A:
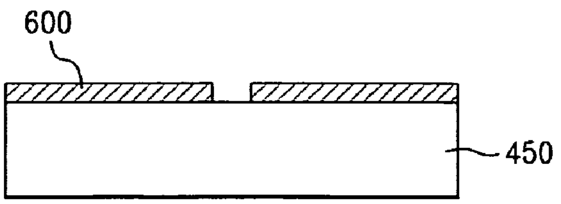
FIGS. 4A to 4D are cross sectional views illustrating a method for manufacturing a printing plate according to an embodiment of the invention.

As shown in FIG. 4A, a mask layer 600 of a predetermined pattern having at least one opening is formed on a substrate 450. The mask layer 600 is formed of a material having a small deformation ratio to an etchant for the substrate 450. The mask layer 600 may be formed in a single-layered structure or a dual-layered structure of chrome Cr, molybdenum Mo, cupper Cu or indium-tin-oxide ITO.

FIGS. 5A to 5D are cross sectional views of illustrating a method for forming a mask layer of a predetermined pattern on a substrate according to the present invention. A preferable method for forming the mask layer 600 of the predetermined pattern on the substrate 450 will be described with reference to FIGS. 5A to 5D.

Figure 5A:
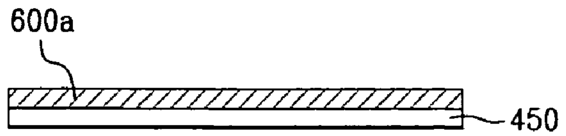
FIGS. 5A to 5D are cross sectional views illustrating a method for forming a mask layer of a predetermined pattern on a substrate according to an embodiment of the invention.
Figure 5B:
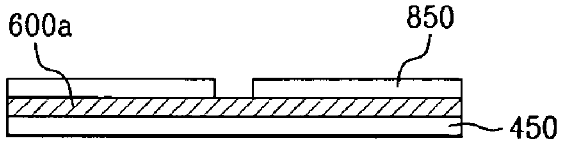

As shown in FIG. 5A, a metal layer 600*a* for the mask layer 600 is deposited on the substrate 450. Then, as shown in FIG. 5B, a photoresist 850 is deposited on the metal layer 600*a*, and is patterned by exposure and development to have at least one opening. At this time, the photoresist 850 may be patterned by a related art printing roller.

Figure 5C:
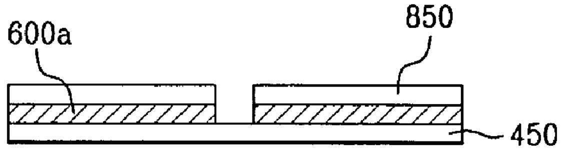

Referring to FIG. 5C, the metal layer 600*a* is selectively removed using the patterned photoresist 850 as a mask.

Figure 5D:
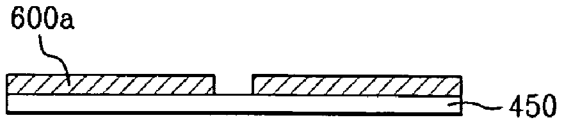

As shown in FIG. 5D, the mask layer of the metal layer 600*a* is formed by removing the photoresist 850.

Figure 4B:
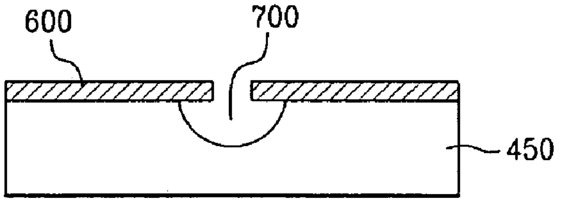

The mask layer 600 of the predetermined pattern shown in FIG. 4A is formed on the substrate 450 according to the method shown in FIGS. 5A to 5D, however, it is not limited to the method described above and illustrated in FIGS. 5A to 5D. Thereafter, as shown in FIG. 4B, the substrate 450 is selectively removed in an isotropic etching method using the mask layer 600 of the predetermined pattern, to thereby form at least one trench 700. A fluoric acid (HF)-based etchant may be used to selectively etch the substrate 450 and form the at least one trench 700.

Figure 4C:
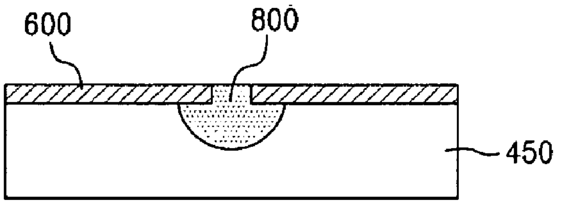

As shown in FIG. 4C, the at least one trench 700 of the substrate 450 is filled with a photoresist 800. For example, the photoresist 800 is formed on an entire surface of the substrate 450. The photoresist 800 is applied in one or two coats. The first coat partially fills the at least one trench 700. Then, where a second coat is applied, the second coat completely fills the at least one trench 700. Next, the photoresist 800 formed on the mask layer 600 is removed by a doctor blade and then a soft bake process is carried out at about 90° C. to about 120° C.

Alternatively, the photoresist 800 formed on the mask layer 600 is not removed by the doctor blade, and the photoresist 800 is removed in instead by the following process.

Figure 4D:
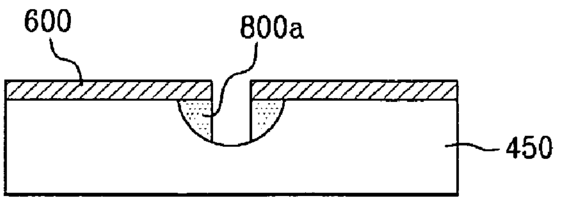

As shown in FIG. 4D, some of the photoresist 800 is removed, to thereby complete a printing plate. When performing the process of removing some of the photoresist 800, exposure and development is applied to the substrate coated with the photoresist 800 by using the mask layer 600 as a mask. After patterning the photoresist, a hard bake process is carried out at about 200° C. to about 270° C.

Although not shown, it is possible to additionally perform a process for removing the mask layer 600.

In the above drawings, only one trench 700 is shown, however, it is possible to provide a plurality of trenches according to the desired pattern shape.

After forming the photoresist 800 in the at least one trench 700, some of the photoresist 800 is removed. Then, an overetched portion of the at least one trench 700 caused by isotropic etching is filled with the remaining photoresist to thereby form sidewall elements 800*a* along an inner perimeter of the at least one trench 700, thereby forming a precise printing plate. Alternatively, the overetched portion may be filled with other materials, which can endure a pressure of a printing roller.

Figure 6A:
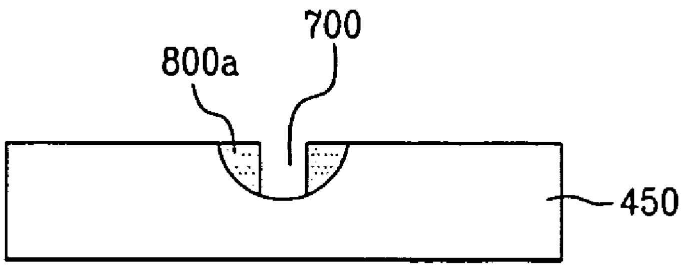
FIGS. 6A and 6B are cross sectional views illustrating a printing plate according to an embodiment of the invention.
Figure 6B:
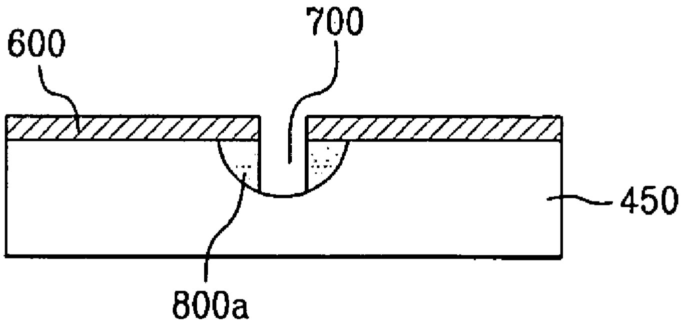

FIGS. 6A and 6B are cross sectional views illustrating the printing plate according to the present invention.

First, as shown in FIG. 6A, the printing plate according to the present embodiment is comprised of the substrate 450 having the at least one trench 700, and sidewall elements 800*a* of the photoresist formed at an inner perimeter of the at least one trench 700.

In one embodiment of the invention, a plurality of trenches are formed corresponding to the pattern, and the sidewall elements 800*a* are formed at the inner sides of the at least one trench 700. One portion of the sidewall elements 800*a*, not in contact with an inner surface of the at least one trench 700, has a substantially vertical sidewall and is formed substantially perpendicular to a surface of the substrate. In accordance with various embodiments of the invention, the sidewall elements 800*a* may be formed of the photoresist or another suitable material.

Also, as shown in FIG. 6B, a mask layer having a predetermined pattern is formed on the sidewall elements 800*a* and on the adjacent surface of the substrate. The mask layer of the predetermined pattern may be formed in a single-layered structure or a dual-layered structure of chrome Cr, molybdenum Mo, copper Cu or indium-tin-oxide ITO.

A method for fabricating an LCD device using the printing plate according to the present invention will now be described with reference to the accompanying drawings.

Figure 7A:
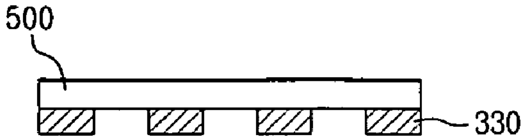
FIGS. 7A to 7D are cross sectional views illustrating a process for fabricating an LCD device according town embodiment of the invention.
Figure 7B:
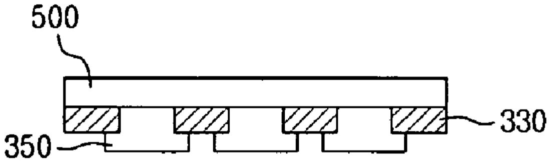
Figure 7C:
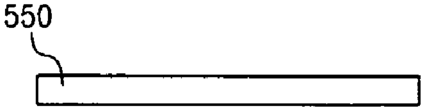

FIGS. 7A to 7D are cross sectional views of illustrating a process for fabricating an LCD device according to the present invention. As shown in FIG. 7A, a black matrix layer 330 is formed on a first substrate 500. Then, as shown in FIG. 7B, a color filter layer 350 is formed on the first substrate 500 including the black matrix layer 330. One or both of the black matrix layer 300 (FIG. 7A) and the color filter layer 350 (FIG. 7B) may be formed by a patterning process using the printing plate described above.

Figure 8A:
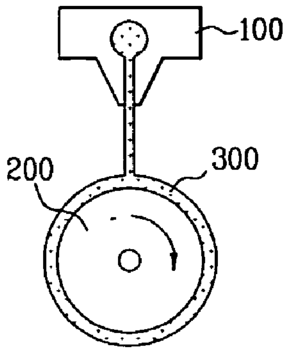
FIGS. 8A to 8C are cross sectional views illustrating a patterning process of a patterning material with a printing plate according to an embodiment of the invention.
Figure 8B:
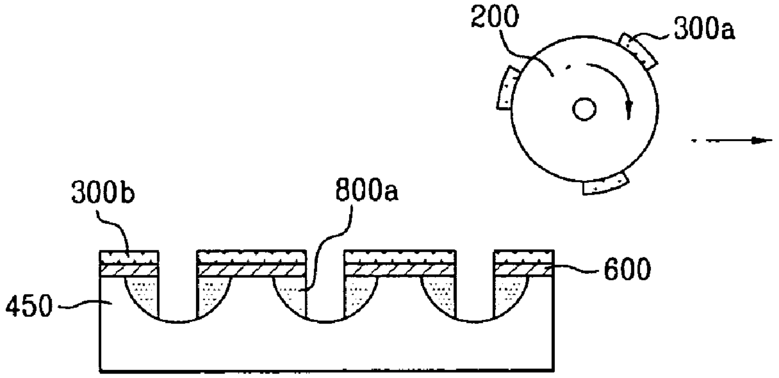
Figure 8C:
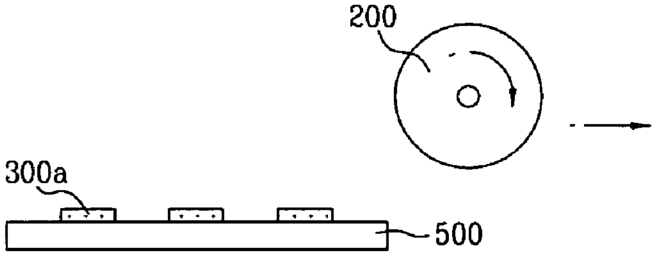

FIGS. 8A to 8C are cross sectional views of illustrating a patterning process of a patterning material with a printing plate according to the present invention.

As shown in FIG. 8A, a pattern material 300 is provided through a printing nozzle 100, and is coated on a printing roller 200.

Then, as shown in FIG. 8B, the printing roller 200 having the pattern material 300 coated thereon rolls on the printing plate shown in FIG. 6A or 6B, whereby pattern material 300*b* is printed on the printing plate and pattern material 300*a* remains on the printing roller 200.

As shown in FIG. 8C, as the printing roller 200 rolls on the first substrate 500, and the pattern material 300*a* remaining on the printing roller 200 is printed onto the first substrate 500.

According to the method shown in FIGS. 8A to 8C, a black matrix material or a color filter material may be coated on the printing roller 200, to thereby form the black matrix layer or the color filter layer, or both, on the first substrate 500.

Referring back to FIG. 7C, a second substrate 550 is prepared. Although not shown, and as is known in the art, the second substrate 550 is comprised of gate and data lines crossing each other to define a unit pixel region, a thin film transistor TFT formed adjacent to a crossing of the gate and data lines, and a pixel electrode formed in the pixel region and connected with the thin film transistor TFT.

In accordance with an embodiment, all elements of the TFT substrate including the gate lines, data lines, pixel electrodes, active layers, and passivation layer of the TFT substrate can be formed using a form of the process illustrated in FIGS. 8A-8C. For example, at least one of more elements on the TFT substrate, an additional substrate is fabricated having the features shown in substrate 450.

In order to form the features of the TFT substrate, a printing plate is formed using the process described above. The dimensions of the structures on the printing plate are changed from that shown for the color filter process to accommodate the feature sizes of the data lines, gate lines, pixel electrodes, and the like on the TFT substrate. The process is carried out using the steps shown in FIGS. 8A-8C, but the printing plate is configured for the feature sizes of the various components in the TFT substrate.

For example, a method for forming the gate lines using the printing plate according to the present invention will now be described.

A metal layer for forming the gate lines is formed on the second substrate 550. A photoresist is provided through a printing nozzle, and is coated on a printing roller.

Then, the printing roller having the photoresist coated thereon rolls on a printing plate for patterning the gate lines as shown in FIG. 6A or 6B, whereby the photoresist is printed on the printing plate for patterning the gate lines and the photoresist remains on the printing roller.

As the printing roller rolls on the second substrate 550 including the metal layer, and the photoresist remaining on the printing roller is printed onto the metal layer.

The metal layer is selectively removed by etching the metal layer using the photoresist as a mask, to thereby form the gate lines.

According to the method shown in FIGS. 8A to 8C, a photoresist may be coated on the printing roller 200, to thereby form the photoresist pattern for forming the data lines, the pixel electrodes, the active layers, or the passivation layer on the second substrate 550.

Therefore, the present invention may not uses a photolithograph process.

Figure 7D:
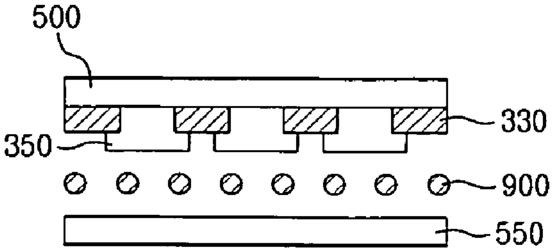

As shown in FIG. 7D, the first and second substrates 500 and 550 are bonded to each other at a predetermined interval therebetween, and a liquid crystal layer 900 is formed between the first and second substrates 500 and 550.

The liquid crystal layer 900 may be formed by a dispensing method or an injection method. If the liquid crystal is applied using the dispensing method, liquid crystal is dispensed on one of the first or second substrates 500 and 550, and then the first and second substrates 500 and 550 are bonded to each other.

Where the liquid crystal is applied by the injection method, after forming a sealant to provide an inlet to one of the first or second substrates 500 and 550, the first and second substrates 500 and 550 are bonded to each other at a predetermined intervals therebetween. Then, after the bonded substrates are cut to form individual LCD panels, liquid crystal is injected to a space between the first and second substrates 500 and 550 by capillary phenomenon and pressure difference.

As mentioned above, the printing plate, the method for manufacturing the printing plate, and the method for fabricating the LCD device using the printing plate according to the present invention have the following advantages. First, after coating the photoresist in the trench, the portion having the etching error caused by isotropic etching is filled with the photoresist. Accordingly, it is possible to decrease the etching error formed in the trench with the related art isotropic etching, to thereby form the precise printing plate. Also, the pattern material is not printed on the both edges of the trench, so that the preciseness of pattern improves. Owing to the precise printing plate, it is unnecessary to perform photolithography, thereby lowering a manufacturing cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A printing plate for roll printing, the printing plate comprising:

a substrate having a trench, the trench comprising an inner trench surface having a vertical cross sectional shape of a semicircle;

a sidewall element comprising a first sidewall surface and a second sidewall surface different from the first sidewall surface, wherein the first sidewall surface is directly contacted to the inner trench surface, and the second sidewall surface is disposed substantially perpendicular to a surface of the substrate.

2. The printing plate of claim 1, wherein the sidewall element comprises photoresist.

3. The printing plate of claim 1, further comprising a mask layer formed on the sidewall elements and on a surface of the substrate adjacent to the trench.

4. The printing plate of claim 3, wherein the mask layer comprises a single-layered structure comprising one of chrome Cr, molybdenum Mo, copper Cu or indium-tin-oxide ITO.

5. The printing plate of claim 3, wherein the mask layer comprises a dual-layered structure comprising one or more of chrome Cr, molybdenum Mo, copper Cu or indium-tin-oxide ITO.

6. The printing plate of claim 1, wherein a top surface of the sidewall element is the same plane with the surface of the substrate.

* * * * *